(12) United States Patent
Bhatnagar et al.

(10) Patent No.: US 12,080,558 B2
(45) Date of Patent: Sep. 3, 2024

(54) LOW TEMPERATURE DEPOSITION OF PURE MOLYBDENUM FILMS

(71) Applicant: Applied Materials, Inc., Santa Clara, CA (US)

(72) Inventors: Kunal Bhatnagar, Chandler, AZ (US); Dmitrii Leshchev, Gatchina (RU); Mohith Verghese, Phoenix, AZ (US); Jose Alexandro Romero, Scottsdale, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/379,515

(22) Filed: Oct. 12, 2023

(65) Prior Publication Data

US 2024/0047215 A1    Feb. 8, 2024

Related U.S. Application Data

(62) Division of application No. 17/183,474, filed on Feb. 24, 2021, now Pat. No. 11,854,813.

(51) Int. Cl.
| | | |
|---|---|---|
| H01L 21/285 | (2006.01) | |
| C23C 16/14 | (2006.01) | |
| C23C 16/44 | (2006.01) | |
| C23C 16/455 | (2006.01) | |

(52) U.S. Cl.
CPC ........ *H01L 21/28556* (2013.01); *C23C 16/14* (2013.01); *C23C 16/4408* (2013.01); *C23C 16/45553* (2013.01)

(58) Field of Classification Search
CPC .................................................. C23C 16/14
See application file for complete search history.

(56) References Cited

U.S. PATENT DOCUMENTS

| | | |
|---|---|---|
| 4,992,305 A | 2/1991 | Erbil |
| 7,390,360 B2 | 7/2008 | Shenai-Khatkhate et al. |
| 7,964,505 B2 | 6/2011 | Khandelwal et al. |
| 9,587,117 B2 | 3/2017 | Yerushalmi et al. |
| 9,881,796 B2 | 1/2018 | Sato et al. |
| 9,932,671 B2 | 4/2018 | Blackwell et al. |
| 10,079,144 B2 | 9/2018 | Kim et al. |
| 11,295,980 B2 * | 4/2022 | Zope .................. H01L 21/76877 |
| 2007/0154637 A1 | 7/2007 | Mnayak et al. |

(Continued)

FOREIGN PATENT DOCUMENTS

| | | |
|---|---|---|
| WO | 2008039960 A1 | 4/2008 |
| WO | 2016024407 A1 | 2/2016 |

OTHER PUBLICATIONS

Bertuch, Adam, et al., "Plasma enhanced atomic layer deposition of molybdenum carbide and nitride with bis(tert-butylimido)bis(dimethylamido) molybdenum", Journal of Vacuum Science & Technology A 35, 018141 (2017); doi: 10.1116/1.4972776.

(Continued)

*Primary Examiner* — Tuan N Nguyen
(74) *Attorney, Agent, or Firm* — Servilla Whitney LLC

(57) ABSTRACT

Methods for depositing molybdenum films on a substrate are described. The substrate is exposed to a molybdenum halide precursor and an aluminum precursor to form the molybdenum film (e.g., elemental molybdenum) at a low temperature. The exposures can be sequential or simultaneous.

18 Claims, 1 Drawing Sheet

(56) References Cited

U.S. PATENT DOCUMENTS

| | | |
|---|---|---|
| 2013/0202794 A1 | 8/2013 | Dussarrat et al. |
| 2016/0002786 A1 | 1/2016 | Gatineau et al. |
| 2016/0133837 A1 | 5/2016 | Hsueh et al. |
| 2018/0294187 A1 | 10/2018 | Thombare et al. |
| 2019/0067003 A1 | 2/2019 | Zope et al. |
| 2019/0067094 A1 | 2/2019 | Zope et al. |
| 2019/0088555 A1 | 3/2019 | Xie et al. |
| 2020/0071816 A1 | 3/2020 | Lei et al. |
| 2020/0283898 A1 | 9/2020 | Choi et al. |

OTHER PUBLICATIONS

Juppo, Marika, et al., "Deposition of molybdenum thin films by an alternate supply of MoCl 5 and Zn", Journal of Vacuum Science & Technology A 16, 2845 (1998); doi: 0.1116/1.581430.

Land, Michael A., et al., "Ligand-Assisted Volatilization and Thermal Stability of Bis(imido)dichloromolybdenum(VI) ([(t-BuN̈)2MoCl2]2) and Its Adducts", Organometallics 2020, 39 (7), 916-927.

Mouat, Aidan R., et al., "Volatile Hexavalent Oxo-amidinate Complexes: Molybdenum and Tungsten Precursors for Atomic Layer Deposition", Chem. Mater. 2016, 28, 1907-1919, Feb. 26, 2016.

* cited by examiner

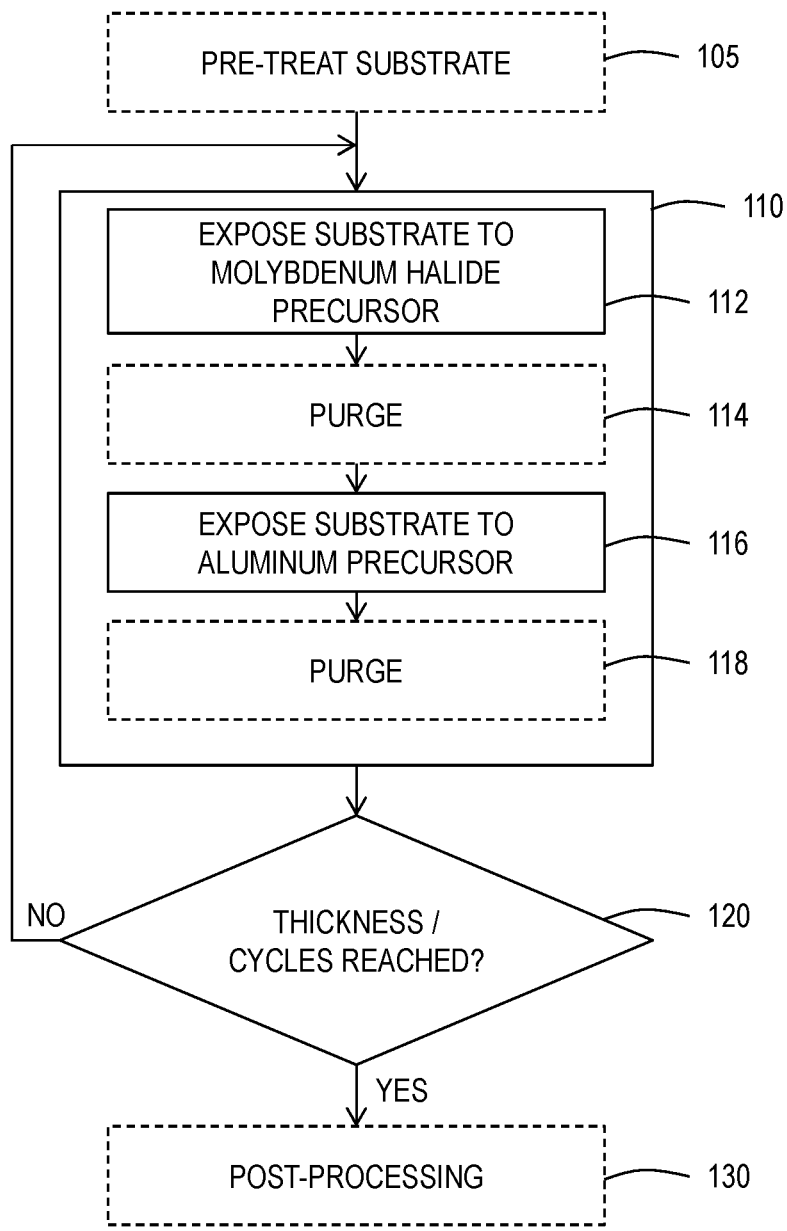

LOW TEMPERATURE DEPOSITION OF PURE MOLYBDENUM FILMS

CROSS-REFERENCE TO RELATED APPLICATIONS

This application is a Divisional of U.S. patent application Ser. No. 17/183,474, filed on Feb. 24, 2021, the entire disclosure of which is hereby incorporated by reference herein.

TECHNICAL FIELD

Embodiments of the disclosure relate to methods for depositing molybdenum films. More particularly, embodiments of the disclosure are directed to methods comprising exposing a substrate to a molybdenum halide precursor and an aluminum precursor to form a molybdenum film.

BACKGROUND

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

The advancing complexity of advanced microelectronic devices is placing stringent demands on currently used deposition techniques. Unfortunately, there is a limited number of viable chemical precursors available that have the requisite properties of robust thermal stability, high reactivity, and vapor pressure suitable for film growth to occur. In addition, precursors that often meet these requirements still suffer from poor long-term stability and lead to thin films that contain elevated concentrations of contaminants such as oxygen, nitrogen, and/or halides that are often deleterious to the target film application.

Molybdenum and molybdenum-based films have attractive material and conductive properties. These films have been proposed and tested for applications from front end to back end parts of semiconductor and microelectronic devices. It is challenging to grow pure molybdenum films with commonly available halide precursors because the deposition methods require high pressure and temperature due to limited reaction kinetics. Middle end of line (MEOL) and back end of line (BEOL) applications require low temp (<350° C.), low resistivity pure molybdenum films for trench and via fill applications. There is, therefore, a need in the art for methods of forming molybdenum films at low temperatures.

SUMMARY

One or more embodiments of the disclosure are directed to a method of depositing a film. In one or more embodiments, a method of depositing a film comprises: exposing a substrate to a molybdenum halide precursor and an aluminum precursor to form a molybdenum film on the substrate.

Further embodiments of the disclosure are directed to methods of depositing a film. In one or more embodiments, a molybdenum film is formed in a process cycle comprising sequential exposure of a substrate to a molybdenum halide precursor, a purge gas, an aluminum precursor, and a purge gas.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

FIG. 1 illustrates a process flow diagram of a method in accordance with one or more embodiments of the disclosure.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Embodiments of the disclosure provide processes for depositing molybdenum films. The process comprises exposing a substrate to both a molybdenum halide precursor and an aluminum precursor. The process of various embodiments uses vapor deposition techniques, such as an atomic layer deposition (ALD) or chemical vapor deposition (CVD) to provide molybdenum films. The molybdenum precursors of one or more embodiments are volatile and thermally stable, and, thus, suitable for vapor deposition.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, silicon germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate is exposed sequentially to the two or more reactive compounds which are introduced into a reaction zone of a processing chamber. In a time-domain ALD process, exposure to each reactive compound is separated by a time delay allowing each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second time delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Deposition of molybdenum films typically involves using hydrogen ($H_2$) gas as a reducing agent and requires temperatures greater than 450° C. Such reactions are not thermodynamically favorable at these high temperatures. Without intending to be bound by theory, it is thought that reacting halide precursors with aluminum, as a reducing species, will lead to deposition of molybdenum films at lower temperatures as a result of thermodynamically favorable reactions.

Molybdenum (Mo) can be grown by atomic layer deposition or chemical vapor deposition for many applications. One or more embodiments of the disclosure advantageously provide processes for atomic layer deposition or chemical vapor deposition to form molybdenum films. As used in this specification and the appended claims, the terms "molybdenum film" or "pure molybdenum film" refers to a film that comprises molybdenum atoms and has greater than or equal to about 90 atomic % molybdenum, or greater than or equal to 95 atomic % molybdenum, or great than or equal to 99 atomic % molybdenum. In some embodiments, the molybdenum film comprises molybdenum metal (elemental molybdenum). In some embodiments, the major composition of the specified film (i.e., the sum of the atomic percent of the specified atoms) is greater than or equal to about 95%, 98%, 99% or 99.5% of the film, in atomic percent.

With reference to FIG. 1, one or more embodiments of the disclosure are directed to method 100 of depositing a film. The method illustrated in FIG. 1 is representative of an atomic layer deposition (ALD) process in which the substrate or substrate surface is exposed sequentially to the reactive gases in a manner that prevents or minimizes gas phase reactions of the reactive gases. In some embodiments, the method comprises a chemical vapor deposition (CVD) process in which the reactive gases are mixed in the processing chamber to allow gas phase reactions of the reactive gases and deposition of the thin film.

In some embodiments, the method 100 includes a pre-treatment operation 105. The pre-treatment can be any suitable pre-treatment known to the skilled artisan. Suitable pre-treatments include, but are not limited to, pre-heating, cleaning, soaking, native oxide removal, or deposition of an adhesion layer (e.g., titanium nitride (TiN)). In one or more embodiments, an adhesion layer, such as titanium nitride, is deposited at operation 105. In other embodiments, molybdenum can be integrated without the need for an adhesion liner.

At deposition 110, a process is performed to deposit a molybdenum film on the substrate (or substrate surface). The deposition process can include one or more operations to form a film on the substrate. In operation 112, the substrate (or substrate surface) is exposed to a molybdenum halide precursor to deposit a film on the substrate (or substrate surface). The molybdenum halide precursor can be any suitable molybdenum-containing compound that can react with (i.e., adsorb or chemisorb onto) the substrate surface to leave a molybdenum-containing species on the substrate surface.

In one or more embodiments, the molybdenum halide precursor comprises any suitable precursor known to the skilled artisan. Some embodiments utilize molybdenum halide precursors selected from one or more of a molybdenum halide, a molybdenum carbonyl halide, and an organomolybdenum halide.

As used herein, the term "halide" refers to a compound, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F—), chloride (Cl—), bromide (Br—), iodide (I—), and astatide (At—). Accordingly, as used herein, the term "molybdenum halide" refers to any coordination complex of molybdenum with a halide anion. The term molybdenum halide includes molybdenum mixed halides which have at least two different halide anions.

In one or more embodiments, the molybdenum halide is selected from one or more of molybdenum chloride, molybdenum bromide, molybdenum iodide, molybdenum bromochloride, molybdenum bromoiodide, molybdenum chlorobromide, molybdenum chloroiodide, molybdenum iodobromide, molybdenum iodochloride, molybdenum tetrachloride oxide, molybdenum tetrabromide oxide, molybdenum tetraiodide oxide, molybdenum dibromide dioxide, molybdenum dichloride dioxide, and molybdenum diiodide dioxide.

As used herein, the term "organomolybdenum halide" includes any coordination complex of molybdenum with an organic ligand and a halide anion. The organomolybdenum halide may comprise any suitable compound known to the skilled artisan. In some embodiments, the organic ligand can comprise any suitable organic ligand known to the skilled artisan.

As used herein, the term "carbonyl" refers to carbon monoxide as a ligand. Accordingly, as used herein, the term "molybdenum carbonyl halide" refers to any coordination complex of molybdenum with carbonyl and with a halide anion.

In specific embodiments, the molybdenum carbonyl halide comprises one or more of molybdenum tetracarbonyl dichloride, molybdenum tetracarbonyl dibromide, and molybdenum tetracarbonyl diiodide.

In specific embodiments, the organomolybdenum halide comprises one or more of molybdocene dichloride, molybdocene dibromide, molybdocene diiodide.

As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the molybdenum-containing layer, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the molybdenum-containing layer may be at least partially formed thereon. For example, in some embodiments, a layer comprising a metal, a nitride, an oxide, or the like, or combinations thereof may be disposed on the substrate and may have the molybdenum containing layer formed upon such layer or layers.

At operation 114, the processing chamber is optionally purged to remove unreacted molybdenum halide precursor, reaction products, and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the molybdenum halide precursor by any suitable technique including, but not limited to, moving the substrate through a gas curtain to a portion or sector of the processing chamber that contains none or substantially none of the molybdenum halide precursor. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of argon (Ar), nitrogen ($N_2$), hydrogen ($H_2$), and helium (He).

At operation 116, the substrate (or substrate surface) is exposed to an aluminum precursor, as a reductant, to form a molybdenum film on the substrate. The aluminum precursor can react with the molybdenum-containing species on the substrate surface to form the molybdenum film. In some embodiments, the aluminum precursor comprises any suitable organic aluminum compound. In one or more embodiments, the aluminum precursor comprises one or more of dimethyl aluminum hydride, aluminum metal (elemental aluminum), aluminum chloride, trimethyl aluminum, triethyl aluminum, and diethyl aluminum hydride.

At operation 118, the processing chamber is optionally purged after exposure to the aluminum precursor. Purging the processing chamber in operation 118 can be the same process or different process than the purge in operation 114. Purging the processing chamber, portion of the processing chamber, area adjacent the substrate surface, etc., removes unreacted aluminum precursor, reaction products and by-products from the area adjacent the substrate surface.

At decision 120, the thickness of the deposited film, or number of cycles of molybdenum-precursor and aluminum precursor is considered. If the deposited film has reached a predetermined thickness or a predetermined number of process cycles have been performed, the method 100 moves to an optional post-processing operation 130. If the thickness of the deposited film or the number of process cycles has not reached the predetermined threshold, the method 100 returns to operation 110 to expose the substrate surface to the molybdenum halide precursor again in operation 112 and continuing.

The optional post-processing operation 130 can be, for example, a process to modify film properties (e.g., annealing) or a further film deposition process (e.g., additional ALD or CVD processes) to grow additional films. In some embodiments, the optional post-processing operation 130 can be a process that modifies a property of the deposited film. In some embodiments, the optional post-processing operation 130 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film. In one or more embodiments, annealing can also with performed with a gas under plasma. In one or more embodiments, the annealing temperature may be lower with plasma.

In one or more embodiments, the plasma comprises one or more of nitrogen ($N_2$), argon (Ar), helium (He), hydrogen ($H_2$), carbon monoxide (CO), carbon dioxide ($CO_2$) methane ($CH_4$), and ammonia ($NH_3$). In some embodiments, the plasma is a remote plasma. In other embodiments, the plasma is a direct plasma.

In one or more embodiments, the plasma may be generated remotely or within the processing chamber. In one or more embodiments, the plasma is an inductively coupled plasma (ICP) or a conductively coupled plasma (CCP). In other embodiments, the plasma is a microwave plasma. Any suitable power can be used depending on, for example, the reactants, or the other process conditions. In some embodiments, the plasma is generated with a plasma power in the range of about 10 W to about 3000 W. In some embodiments, the plasma is generated with a plasma power less than or equal to about 3000 W, less than or equal to about 2000 W, less than or equal to about 1000 W, less than or equal to about 500 W, or less than or equal to about 250 W.

The method 100 can be performed at any suitable temperature depending on, for example, the molybdenum halide precursor, the aluminum precursor, or thermal budget of the device. In one or more embodiments, the use of high temperature processing may be undesirable for temperature-sensitive substrates, such as logic devices. In some embodiments, exposure to the molybdenum halide precursor (operation 112) and the aluminum precursor (operation 116) occur at the same temperature. In some embodiments, the substrate is maintained at a temperature in a range of about 20° C. to about 350° C., or about 50° C. to about 350° C.

In some embodiments, exposure to the molybdenum halide precursor (operation 112) occurs at a different temperature than the exposure to the aluminum precursor (operation 116). In some embodiments, the substrate is maintained at a first temperature in a range of about 20° C. to about 350° C., or about 50° C. to about 350° C., for the exposure to the molybdenum halide precursor, and at a second temperature in the range of about 20° C. to about 350° C., or about 50° C. to about 350° C., for exposure the aluminum precursor.

In the embodiment illustrated in FIG. 1, at deposition operation 110 the substrate (or substrate surface) is exposed to the molybdenum halide precursor and the aluminum precursor sequentially. In some embodiments, the substrate (or substrate surface) is exposed to the molybdenum halide precursor first, followed by exposure to the aluminum precursor second. In other embodiments, the substrate (or substrate surface) is exposed to the aluminum precursor first, followed by exposure to the molybdenum halide precursor second. In another, un-illustrated, embodiment, the substrate (or substrate surface) is exposed to the molybdenum halide precursor and the aluminum precursor substantially simultaneously in a CVD reaction. In a CVD reaction, the substrate (or substrate surface) can be exposed to a gaseous mixture of the molybdenum halide precursor and aluminum precursor to deposit a molybdenum film having a predetermined thickness. In the CVD reaction, the molybdenum film can be deposited in one exposure to the mixed reactive gas or can be multiple exposures to the mixed reactive gas with purges between.

In some embodiments, the molybdenum film formed comprises elemental molybdenum. Stated differently, in some embodiments, the molybdenum film comprises a metal film comprising molybdenum. In some embodiments, the metal film consists essentially of molybdenum. As used in this manner, the term "consists essentially of molybdenum" means that the content of molybdenum in the film is greater than or equal to about 80%, 85%, 90%, 95%, 98%, 99% or 99.5% molybdenum, in atomic percent. Measurements of the composition of the molybdenum film refer to the bulk portion of the film, excluding interface regions where diffusion of elements from adjacent films may occur.

The deposition operation 110 can be repeated to form a molybdenum film, having a predetermined thickness. In some embodiments, the deposition operation 110 is repeated to provide a molybdenum film having a thickness in the range of from about 10 Å to about 3000 Å, or a range of from about 10 Å to about 500 Å.

One or more embodiments of the disclosure are directed to methods of depositing molybdenum films in high aspect ratio features. A high aspect ratio feature is a trench, via or pillar having a height: width ratio greater than or equal to about 10, 20, or 50, or more. In some embodiments, the molybdenum film is deposited conformally on the high aspect ratio feature. As used in this manner, a conformal film has a thickness near the top of the feature that is in the range of about 80-120% of the thickness at the bottom of the feature.

Some embodiments of the disclosure are directed to methods for bottom-up gapfill of a feature. A bottom-up gapfill process fills the feature from the bottom versus a conformal process which fills the feature from the bottom and sides. In some embodiments, the feature has a first material at the bottom (e.g., a nitride) and a second material (e.g., an oxide) at the sidewalls. The molybdenum film deposits selectively on the first material relative to the second material so that the molybdenum film fills the feature in a bottom-up manner.

According to one or more embodiments, the substrate may be subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation, and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Atomic Layer Deposition of Molybdenum Films

General procedure: A silicon substrate is placed in a processing chamber. A molybdenum halide precursor is flowed into the processing chamber in an atmosphere of nitrogen ($N_2$) gas over the silicon substrate leaving a molybdenum-precursor terminated surface. Unreacted precursor and byproducts are then purged out of the chamber. Next, an aluminum precursor, e.g., dimethyl aluminum hydride, is then introduced into the chamber that reacts with the surface-bound molybdenum species. Again, excess co-reactant and byproducts are removed from the chamber. The resultant material on the substrate is a molybdenum film.

Spatially relative terms, such as "beneath," "below," "lower," "above," "upper" and the like, may be used herein for ease of description to describe one element or feature's relationship to another element(s) or feature(s) as illustrated in the FIGURES. It will be understood that the spatially relative terms are intended to encompass different orientations of the device in use or operation in addition to the orientation depicted in the FIGURES. For example, if the device in the FIGURES is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

The invention claimed is:

1. A method of depositing a film, the method comprising: exposing a substrate to a molybdenum halide precursor and an aluminum precursor to form a molybdenum film on the substrate, wherein the substrate is exposed to the molybdenum halide precursor and the aluminum precursor sequentially.

2. The method of claim 1, wherein the molybdenum halide precursor comprises one or more of a molybdenum halide, a molybdenum carbonyl halide, and an organomolybdenum halide.

3. The method of claim 1, wherein the aluminum precursor comprises an organic aluminum compound.

4. The method of claim 3, wherein the aluminum precursor comprises one or more of dimethyl aluminum hydride, aluminum metal (elemental aluminum), aluminum chloride, trimethyl aluminum, triethyl aluminum, and diethyl aluminum hydride.

5. The method of claim 1, further comprising purging the substrate of the molybdenum halide precursor prior to exposing the substrate to the aluminum precursor.

6. The method of claim 1, wherein purging comprises one or more of applying a vacuum or flowing a purge gas over the substrate.

7. The method of claim 1, wherein the substrate is exposed to the molybdenum halide precursor at a temperature less than 350° C.

8. The method of claim 7, wherein the purge gas comprises one or more of argon (Ar), nitrogen ($N_2$), hydrogen ($H_2$), and helium (He).

9. The method of claim 1, further comprising repeating the method to provide the molybdenum film having a thickness in a range of from 10 Å to about 500 Å.

10. The method of claim 1, wherein the molybdenum film comprises greater than 99% molybdenum by atomic percent.

11. A method of depositing a film, the method comprising:
forming a molybdenum film in a process cycle comprising sequential exposure of a substrate to a molybdenum halide precursor, a first purge gas, an aluminum precursor, and a second purge gas.

12. The method of claim 11, wherein the molybdenum halide precursor comprises one or more of a molybdenum halide, a molybdenum carbonyl halide, and an organomolybdenum halide.

13. The method of claim 11, wherein the aluminum precursor comprises an organic aluminum compound.

14. The method of claim 13, wherein the aluminum precursor comprises one or more of dimethyl aluminum hydride, aluminum metal (elemental aluminum), aluminum chloride, trimethyl aluminum, triethyl aluminum, and diethyl aluminum hydride.

15. The method of claim 11, wherein the first purge gas and the second purge gas independently comprise one or more of argon (Ar), nitrogen ($N_2$), hydrogen ($H_2$), and helium (He).

16. The method of claim 11, wherein the substrate is exposed to the molybdenum halide precursor at a temperature less than 350° C.

17. The method of claim 11, further comprising repeating the method to provide the molybdenum film having a thickness in a range of from 10 Å to about 500 Å.

18. The method of claim 11, wherein the substrate comprises at least one feature and the molybdenum film forms in the feature.

* * * * *